United States Patent
Wu et al.

(10) Patent No.: US 9,696,506 B2
(45) Date of Patent: Jul. 4, 2017

(54) CONNECTOR HOUSING ASSEMBLY AND CONNECTOR HAVING THE SAME

(71) Applicant: Tyco Electronics (Shanghai) Co. Ltd., Shanghai (CN)

(72) Inventors: Honghao Wu, Shanghai (CN); Marshall Chen, Shanghai (CN); Tim Xue, Shanghai (CN); Polly Liu, Shanghai (CN); Helena Sun, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 14/683,843

(22) Filed: Apr. 10, 2015

(65) Prior Publication Data

US 2015/0296638 A1    Oct. 15, 2015

(30) Foreign Application Priority Data

Apr. 10, 2014  (CN) .......................... 2014 1 0150375

(51) Int. Cl.
   H05K 7/20   (2006.01)
   G02B 6/42   (2006.01)

(52) U.S. Cl.
   CPC ....... *G02B 6/4269* (2013.01); *H05K 7/20409* (2013.01); *G02B 6/4249* (2013.01); *G02B 6/4261* (2013.01)

(58) Field of Classification Search
   CPC .......................... G02B 6/4269; H05K 7/20409
   USPC ........................................................ 174/548
   See application file for complete search history.

(56) References Cited

U.S. PATENT DOCUMENTS

| | | | | |
|---|---|---|---|---|
| 6,980,437 B2* | 12/2005 | Bright | ............... | H05K 7/20418 165/185 |
| 7,539,018 B2* | 5/2009 | Murr | .................. | H05K 7/20418 165/185 |
| 8,449,331 B2* | 5/2013 | Phillips | .............. | H01R 13/6581 361/704 |
| 8,885,342 B2* | 11/2014 | Skepnek | ............... | H01L 23/367 174/548 |

(Continued)

OTHER PUBLICATIONS

TE Connectivity Drawings No. 1-5, entitled "1x6 Cage Assembly, Behind Bezel, w/ Light Pipes and Heat Sinks, QSFP", dated Mar. 4, 2010, 5 pages.

*Primary Examiner* — Hung V Ngo
(74) *Attorney, Agent, or Firm* — Barley Snyder

(57) ABSTRACT

A connector housing assembly is disclosed having a housing, a plurality of compressible heat conducting members and a monolithic heat sink. The housing has a first direction corresponding to a height direction of the housing, a second direction parallel to a heat generating module insertion direction, and a third direction perpendicular to the first direction and the second direction. The housing includes a plurality of module receiving ports positioned side by side in the third direction, a plurality of conductor receiving spaces corresponding to the plurality of module receiving ports respectively, and a heat sink installation surface. The plurality of compressible heat conducting members are positioned in the plurality of conductor receiving spaces respectively, each having an elasticity in the first direction. The monolithic heat sink is positioned on a heat sink installation surface of the housing, covering and in surface-contact with the plurality of compressible heat conducting members.

28 Claims, 9 Drawing Sheets

(56) References Cited

U.S. PATENT DOCUMENTS 9,246,280 B2 * 1/2016 Neer .................... G02B 6/4246
2003/0193794 A1 * 10/2003 Reis ...................... H01L 23/552
                                                                                                          361/816

* cited by examiner

Fig. 1a PRIOR ART
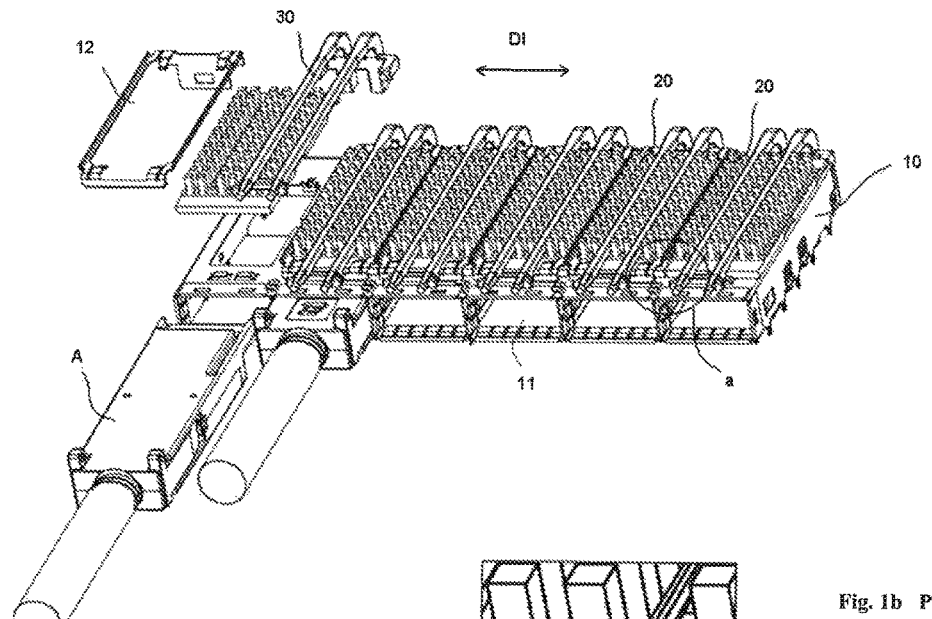
Fig. 1b PRIOR ART
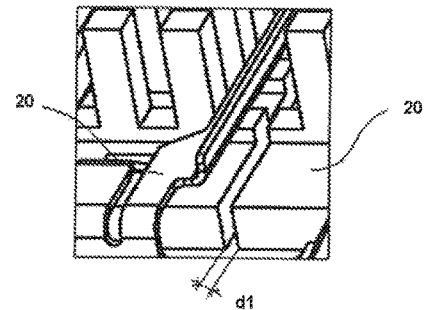
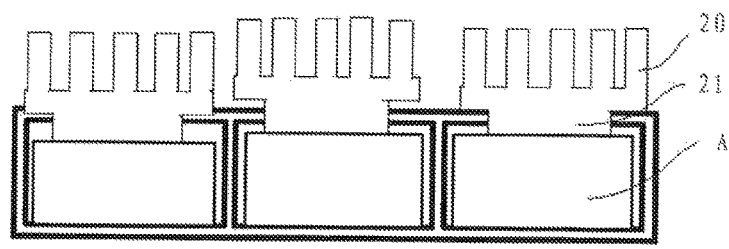
Fig. 1c PRIOR ART

CONNECTOR HOUSING ASSEMBLY AND CONNECTOR HAVING THE SAME

CROSS-REFERENCE TO RELATED APPLICATION

This application claims priority under 35 U.S.C. 119(a)-(d) or (f) to Chinese Patent Application No. 201410150375.6 filed on Apr. 10, 2014.

FIELD OF THE INVENTION

The invention generally relates to an electrical connector, and, more specifically, to a connector housing assembly having an improved heat sink.

BACKGROUND

A 1×N type Small Form Factor (SFF) connector, such as the conventional 1×N type QSFP+ connector shown in FIGS. 1a and 1b or any one of other SFF connectors, typically includes a male optical module. The conventional male optical module A generates between 1.0-4.0 watt power and heat in use. According to heat dissipation requirements on the male optical module A, as shown in FIG. 1a, an independent heat sink 20 is positioned on each module receiving port 11 in a 1×N type housing 10. After the male optical module A is inserted into the housing 10, a bottom of the heat sink 20 contacts a top surface of the male optical module A, and the heat generated by the male optical module A is radiated into air through the heat sink, thereby reducing the temperature of the male optical module A, thus maintaining the normal operation of the male optical module A.

In the conventional male optical module A shown in FIG. 1b, the adjacent heat sinks 20 do not contact each other, and an air gap d1 approximately equal to 0.5 mm is formed therebetween. Each independent heat sink 20 is positioned on the 1×N type housing 10 by a heat sink clamp 12 (see FIG. 1a).

As shoon in FIG. 1c, a boss 21 is formed on a bottom of each heat sink 20. The bottom of the boss 21 contacts the male optical module A. Since the independent heat sink clamp 12 is positioned, the heat sink 20 can tightly contact the male optical module A regardless of height tolerance of the boss 21 and size tolerance of the male optical module A.

The SFF connector may be mounted in a case of a customer device, and inputs an optical signal to the customer device through the male optical module. A corresponding female optical module (e.g. housing 10) receives the optical signal and transmits the received optical signal to other members in the case. In the design of the case of customer device, however, an airflow in a left-right direction DI shown in FIG. 1a is generally adopted to perform heat dissipation.

In the design shown in FIG. 1a, the 1×N type QSFP+ connector comprises a heat sink array of 1×N in the airflow direction DI. However, airflow resistance exists between the heat sink fins. Thus, when the airflow in the airflow direction DI flows through the first and the second columns of heat sinks 20 in the heat sink array of 1×N, the airflow escapes from between the heat sinks 20, and flows toward the upper, the front, and the rear portions where it is not blocked by fins. As a result, the columns of heat sinks further downstream of the heat sink array 20 of 1×N can not be effectively cooled by the airflow.

In addition, in order to permit a light guide pipe 30 (see FIG. 1a) to pass through the heat sink 20, the existing heat sink 20 is generally designed in a pin form. The heat sink 20 has a height no larger than ⅓ of a height of the light guide pipe 30, resulting in the light guide pipe 30 preventing the airflow from flowing through the heat sink 20 because of the presence of the light guide pipe 30. As a result, the light guide pipe 30 further reduces airflow to the last columns of heat sinks 20 in the heat sink array 20.

Furthermore, since of the heat sinks are independent from each other, and the air in the gap between the heat sinks has a very low thermal conductivity (about 0.02 w/mk), the gap d1 cannot effectively form heat convection and essentially acts as a heat insulation between two adjacent heat sinks 20. As a result, heat cannot be transferred between adjacent heat sinks 20 efficiently. Consequently, the last columns of heat sinks 20 in the airflow direction DI have a temperature higher than that of the first column of heat sink by about 10-20° C., depending on actual working condition. Generally, the last two columns of heat sinks in the airflow direction have the highest temperature, and empirically, the male optical modules A corresponding to the last two columns of heat sinks 20 in the airflow direction DI are also conventionally known to be most likely to fail during use.

Therefore, there is an industry need for a SFF connector that overcomes or alleviates the heat dissipation problems discussed above for convention SFF connectors.

The use of a monolithic heat sink, rather than plurality of independent heat sinks, would alleviate some of the heat dissipation problems discussed above. However, the use of a monolithic heat sink directly positioned on an optical module presents a number of challenges and drawbacks.

For example, as shown in FIG. 14, a monolithic heat sink 20' is positioned in direct, thermal contact with an optical module A. A protruding step is positioned at each port of the optical module A in a bottom of a heat sink 20', with each protruding step thermally contacting the optical module A to dissipate the heat. The problem with such an approach is that a height of a boss 21 on the bottom of the heat sink 20' and a size of the optical module A both have manufacturing tolerances. If the optical module A with an upper tolerance limit mates with the boss 21 with an upper tolerance limit, the heat sink 20' may be raised in a height direction. For example, the middle optical module A shown in FIG. 14 raises the heat sink 20' in the height direction. As a result, a gap is produced between the other optical modules A with a tolerance below the upper tolerance limit and the boss 21 on the bottom of the heat sink 20'. This gap prevents the other optical modules with the tolerance below the upper tolerance limit from thermally contacting the boss 21 on the bottom of the heat sink 20'. Therefore, the right and the left optical modules A shown in FIG. 14 cannot contact the boss 21 on the bottom of the heat sink 20'. Thus, the use of a monolithic heat sink in direct contact with the optical module A shown in FIG. 14 fails in actual application.

SUMMARY

It is an object of the invention, among others, to overcome or alleviate at least one aspect of the above mentioned disadvantages.

A connector housing assembly has a housing, a plurality of compressible heat conducting members and a monolithic heat sink. The housing has a first direction corresponding to a height direction of the housing, a second direction parallel to a heat generating module insertion direction, and a third direction perpendicular to the first direction and the second direction. The housing includes a plurality of module receiving ports positioned side by side in the third direction, a plurality of conductor receiving spaces corresponding to the plurality of module receiving ports respectively, and a heat sink installation surface. The plurality of compressible heat conducting members are positioned in the plurality of conductor receiving spaces respectively, each having an elasticity in the first direction. The monolithic heat sink is positioned on a heat sink installation surface of the housing, covering and in surface-contact with the plurality of compressible heat conducting members.

BRIEF DESCRIPTION OF THE DRAWINGS

The invention will now be described by way of example, with reference to the accompanying Figures, of which:

FIG. 1a is a perspective view of a conventional 1×N type QSFP+ connector;

FIG. 1b is an enlarged view of the conventional connector a shown in FIG. 1a;

FIG. 1c is a cross-sectional view of independent heat sinks and optical modules of the conventional connector of FIG. 1a;

FIG. 8b is an enlarged perspective view of Section d shown in FIG. 8a;

FIG. 9b is an enlarged cross-sectional view of Section e shown in FIG. 9a, of the heat sink connecting protrusion mated with the protrusion receiving member;

FIG. 9c is an enlarged cross-sectional view of Section f shown in FIG. 9a, showing a positioning tongue and a bending projection;

FIG. 10a is a cross-sectional view of an optical module before being inserted into the connector housing assembly of FIG. 7a;

FIG. 10b is a cross-section view of the optical module after being inserted into the connector housing assembly of FIG. 7a;

DETAILED DESCRIPTION OF THE PREFERRED EMBODIMENTS

Figure 2A:
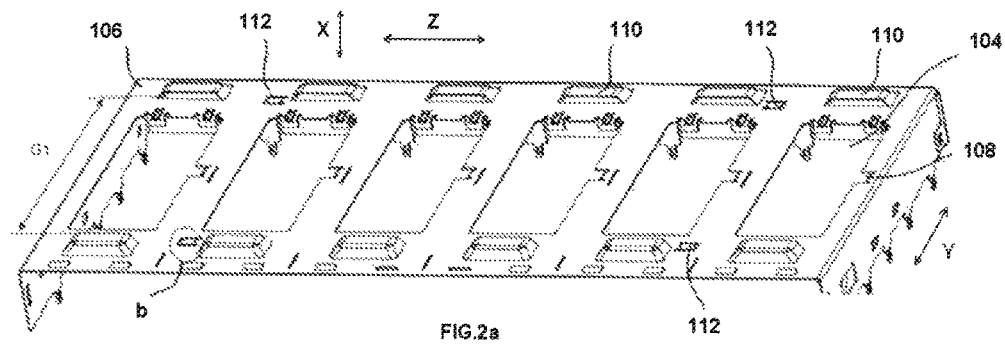
FIG. 2a is a perspective view of a connector housing.
Figure 2B:
FIG. 2b is a plan view of Section b shown in FIG. 2a, showing a positioning tongue.

Exemplary embodiments will be described hereinafter in detail with reference to the attached Figures, wherein the like reference numerals refer to the like elements. The disclosure may, however, be embodied in many different forms and should not be construed as being limited to the embodiment set forth herein, Rather, these embodiments are positioned so that the disclosure will be thorough and complete, and will fully convey the concept of the disclosure to those skilled in the art.

In the following description, for purposes of explanation, numerous specific details are set forth in order to provide a thorough understanding of the embodiments. Those of ordinary skill in the art would appreciate that one or more embodiments may be practiced without these specific details. In other instances, well-known structures and devices are schematically shown in order to simplify the drawing.

A connector housing assembly will now be described with reference to FIGS. 2a-10b.

In an embodiment shown in FIGS. 2a-10b, the connector housing assembly has a housing 100, a plurality of compressible heat conducting members 200, and a monolithic heat sink 300.

As shown in FIGS. 2a, 5a, 6a and 6b, the housing 100 has a plurality of module receiving ports 102 and a plurality of conductor receiving spaces 104 (see FIG. 2a) In an embodiment, the each module receiving port 102 is paired with one conductor receiving space 104. Each module receiving port 102 receives a heat generating module A (see FIG. 10b) therein. The housing 100 defines a first direction X corresponding to a height direction of the housing, a second direction Y parallel to a direction of inserting the heat generating module A into the module receiving port 102, and a third direction Z perpendicular to the first direction X and the second direction Y. The plurality of module receiving ports 102 are positioned side by side in the third direction Z.

One compressible heat conducting member 200 (see FIG. 6b) is positioned in a corresponding conductor receiving space 104, respectively, to conduct heat generated by one respective heat generating module A inserted into the module receiving port 102. Each of the compressible heat conducting members 200 has elasticity in the first direction X.

The housing 100 has a heat sink installation surface 106, and the monolithic heat sink 300 is positioned on the heat sink installation surface 106 so as to cover and surface-contact the plurality of heat conducting members 200.

Figure 14:
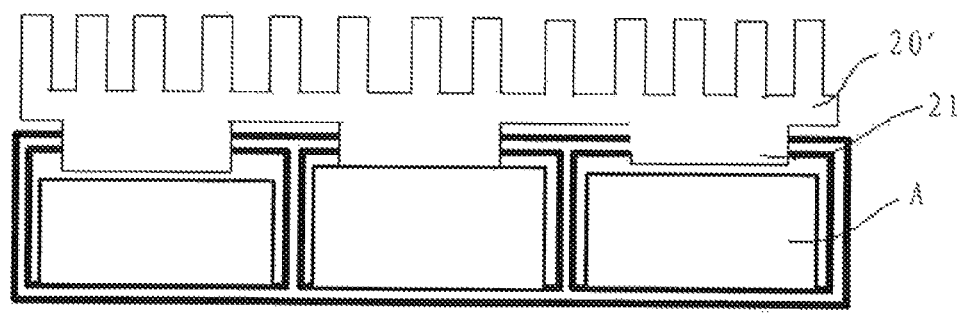
FIG. 14 is a cross-sectional view of a monolithic heat sink and an optical module in thermal contact with each other.

In contrast to the design shown in FIG. 14, in the current invention, although the heat sink 300 is configured to be a monolithic heat sink, the heat conducting member 200 has elasticity in the first direction X, and the heat sink 300 may absorb any resulting gap between a surface of a heat generating module and the heat conducting member 200 caused by a manufacturing tolerance of the heat generating module A. Meanwhile, since the heat conducting member 200 is elastic, when the heat sink 300 is covered and pressed on the heat conducting member 200, the heat sink 300 still can tightly and thermally contact the compressible heat conducting member 200. Furthermore, since the heat sink 300 is an integral member, it can prevent the problem that adjacent heat sinks are spaced from each other and cannot conduct heat therebetween in the prior art shown in FIG. 1a. Therefore, heat of the hottest part at a downstream air port can be transferred to a part with lower temperature at an upstream air port through the monolithic heat sink 300, decreasing the disadvantageous effect due to uneven airflow above the heat sink 300. Empirically, the maximum temperature of the heat generating module may be reduced by 2-3° C.

By replacing the six heat sinks 20 shown in FIG. 1a with a single heat sink 300, efficiency is increased in the assembly of the heat sink 300 to the heat conducting members 200. Also, by omitting the heat sink clamp 12 shown in FIG. 1a, the manufacturing cost and the assembling cost is further reduced.

The compressible heat conducting member 200 may be any suitable heat conducting material having good thermal conductivity and good elasticity. For example, the compressible heat conducting member 200 may be a heat conduction pad, and the heat conducting pad may be made of a rubber polymer filled with metal particles, such that the heat conducting pad is soft and compressible and has elasticity, and its thermal conductivity is about 3 w/mk. In an embodiment, the compressible heat conducting member 200 may be composed of upper and lower metal plates and a spring array positioned between the upper and lower metal plates.

The assembly of the compressible heat conducting member 200 will be described below.

In an embodiment shown in FIG. 2a, the conductor receiving space 104 is configured to be a substantially rectangular opening. The connector housing assembly further comprises a plurality of conducting member receiving panels 400. In the embodiments shown in FIGS. 4a, 4b, 5a, 5b and 6a, each of the conducting member receiving panels 400 has a receiving recess 402 with a base (not labeled) and circumferentially extending sideway (not labeled) and a panel flange 404 extending around the circumference of the receiving recess 402 as a sidewall thereof. The compressible heat conducting member 200 is positioned in the receiving recess 402, and the receiving recess 402 acts as a boss, being complimentary in shape to the conductor receiving space 104 and being positioned therein. The panel flange 404 is supported on a peripheral edge of the housing 100 around the rectangular opening of the conductor receiving space 104, and the base of the receiving recess 402 is adapted to surface-contact an inserted heat generating module (for example, an optical module A) positioned under the base of the receiving recess 402. The base of the receiving recess 402 extends a distance into the module receiving port 102. The panel flange 404 prevents the conducting member receiving panel 400 from falling into the module receiving port 102 after the conducting member receiving panel 400 is mounted in the conductor receiving space 104. Since the heat conducting member 200 is positioned in the conductor receiving space 104 by the conducting member receiving panel 400, the conducting member receiving panel 400 may be regarded as a component of the conductor receiving space 104.

The conducting member receiving panel 400 may be a block made of metal or other hard materials with good thermal conductivity such as plastic.

Figures 4A, 4B:
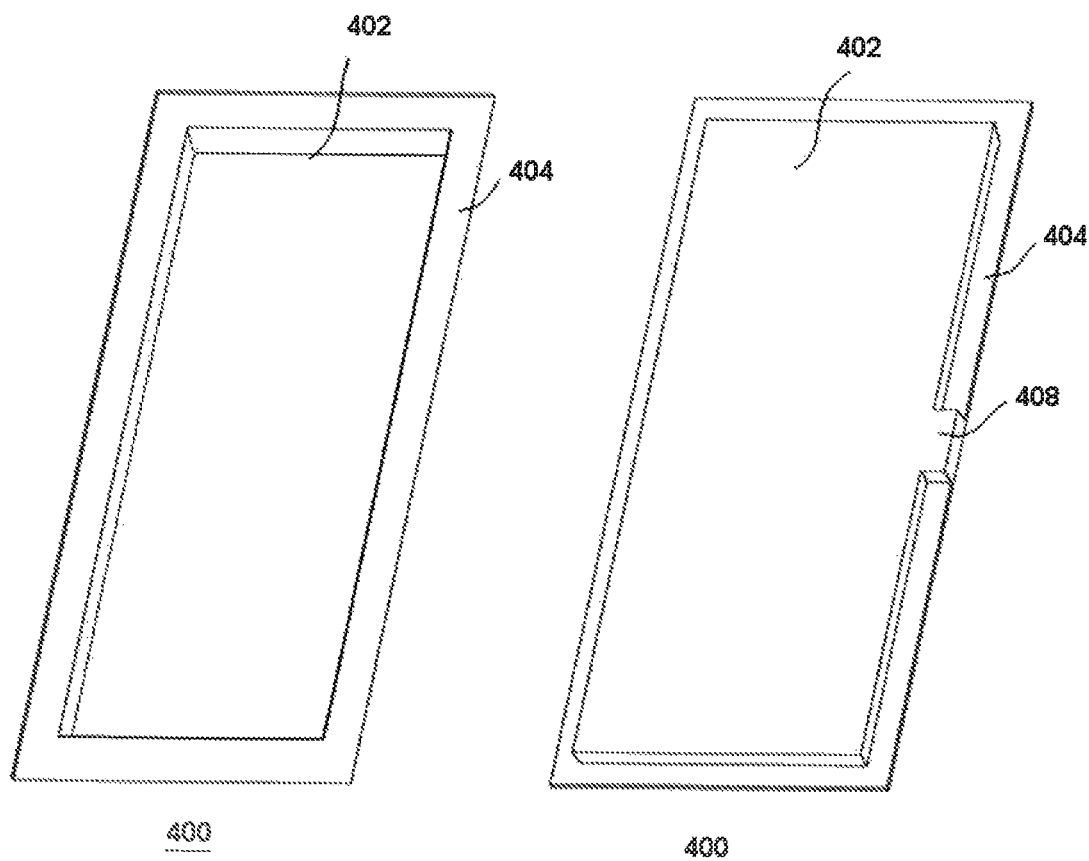
FIG. 4a is a perspective view of a first side of a heat conduction block.
FIG. 4b is a perspective view of a second side of the heat conduction.
Figures 5A, 5B:
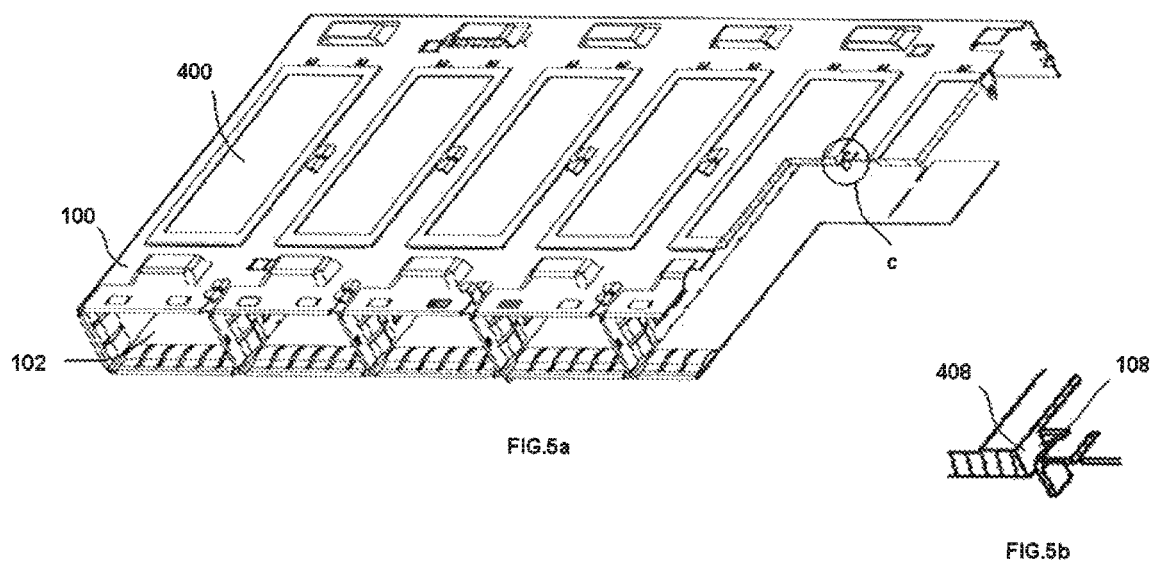
FIG. 5a is a partial cross-sectional view of the heat conduction block positioned on the connector housing.
FIG. 5b is an enlarged view of Section c shown in FIG. 5a, of a protruding block on the heat conduction block mated to a corresponding block receiving notch in the connector housing.

In an embodiment shown in FIG. 2a, a block receiving notch 108 is positioned in one edge of the conductor receiving space 104 of the housing 100. As shown in FIG. 4b, a corresponding protruding block 408 is formed on the conducting member receiving panel 400, on an inward facing surface of the panel flange 404. The protruding block 408 is positioned at a location near or abutting the receiving recess 402, and the protruding block 408 is adapted to be mated in the block receiving notch 108, as shown in FIGS. 5a and 5b.

Figure 3A:
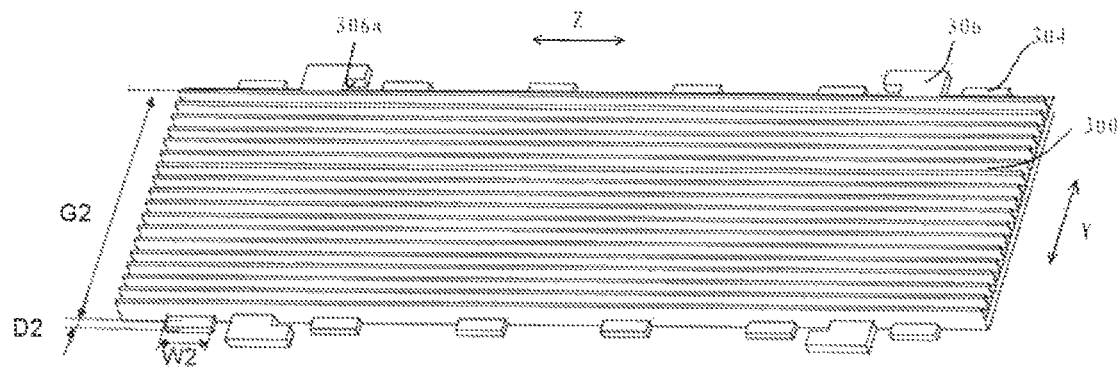
FIG. 3a is a perspective view of a first side of a heat sink having a plurality of heat dissipating fins.
Figure 3B:
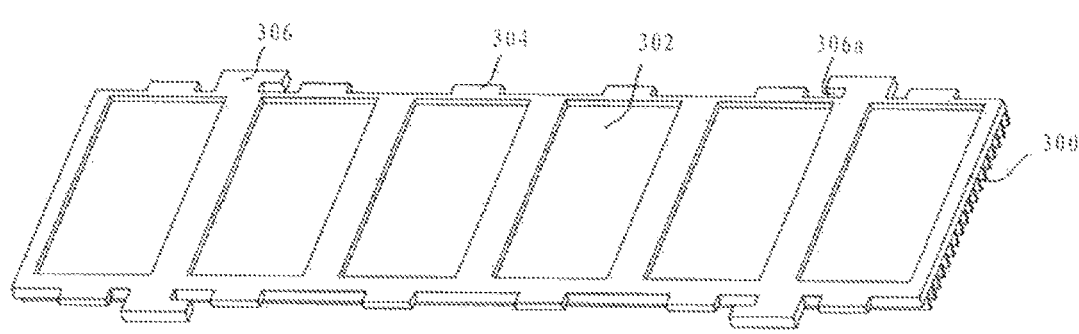
FIG. 3b is a perspective view of a second side of the heat sink.

In an embodiment shown in FIG. 3b, a plurality of panel receiving grooves 302 are disposed on a surface of the heat sink 300 facing the compressible heat conducting member 200. The plurality of panel receiving grooves 302 each is configured to mate with the conducting member receiving panel 400, and each conducting member receiving panel 400 is received in the panel receiving groove 302.

In an embodiment, the compressible heat conducting member 200 may be positioned in the panel receiving groove 302 without the use of the above conducting member receiving panel 400. In embodiment shown in FIG. 11, the compressible heat conducting member 200 is used without an independent conducting member receiving panel 400.

Figure 11:
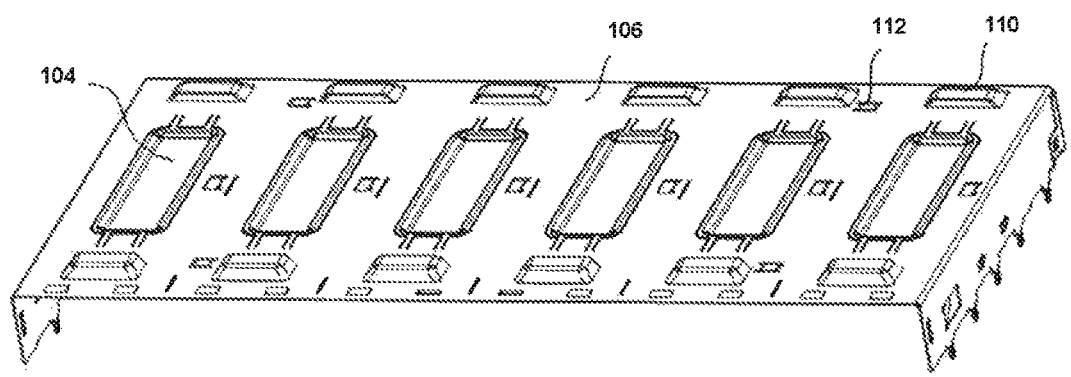
FIG. 11 is a perspective view of a connector housing assembly.
Figure 12:
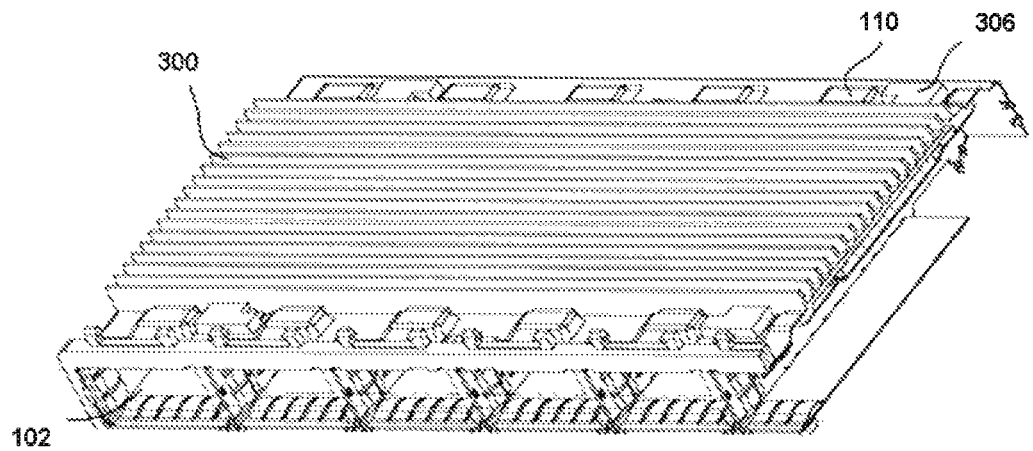
FIG. 12 is a partial cross-sectional view of the connector housing.
Figure 13:
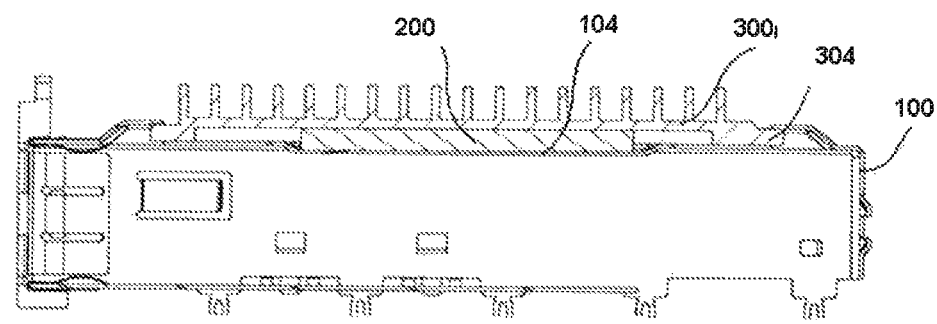
FIG. 13 is a partial cross-sectional view of a side of the connector housing assembly.

As shown in FIG. 11, the conductor receiving space 104 is configured to be a concave elastic sheeting structure positioned on the heat sink installation surface 106 of the connector housing 100. The conductor receiving space 104 is integrally connected with the housing 100, rather than being a separate, independent component. An inner surface of the elastic sheet structure is adapted to surface-contact the heat generating module A under the inner surface of elastic sheet structure. A concave surface of the elastic sheet structure is configured to receive the compressible heat conducting member. The elastic sheet structure may move outward from the heat sink installation surface 106 in the first direction X under an outward pressure, thus ensuring that a base of the elastic sheet structure remains in thermal surface-contact with the heat generating module A. Those of ordinary skill in the art would appreciate that the elastic sheet structure material has good thermal conductivity. The integrally connected elastic sheet structure may be formed by directly punching the heat sink installation surface 106 connector housing 100. Compared with the rigidly fixed conducting member receiving panel 400 in the embodiment shown in FIG. 2a, the elastic sheet structure increases the amount of available elastic movement, through the use of resilient connecting arms (not labeled) that connect the conductor receiving space 104 to the housing 100.

In another embodiment, not shown but understood by those of ordinary skill in the art, both conducting member receiving panel 400, and the conductor receiving space 104 of FIG. 11 may be omitted in some instances. For example, the conductor receiving space 104 is configured to be a substantially rectangular opening. A boss is formed on one side of each compressible heat conducting member 200 in the first direction X. The boss is placed into the respective conductor receiving space 104, so as to define a position of the compressible heat conducting member 200 in the second direction Y and/or the third direction Z. The boss on the compressible heat conducting member 200 is adapted to surface-contact the heat generating module A.

The assembly step of mounting the heat sink 300 on the connector housing 100 will now be described.

In an embodiment, the monolithic heat sink 300 may be directly soldered on the connector housing 100. In another embodiment, the monolithic heat sink 300 may be positioned on the connector housing 100 in any other suitable way known to those of ordinary skill in the art, such as through a fastener, a latching mechanism, an adhesive, or the like.

In an embodiment, a heat sink positioning device may be positioned on the connector housing 100, where the heat sink positioning device is configured to detachably mount the heat sink 300.

Figure 2C:
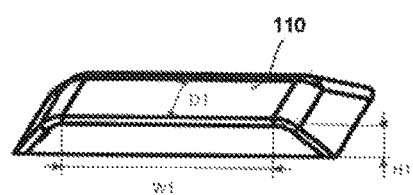
FIG. 2c is an enlarged perspective view of a protrusion protrusion receiving member for receiving a heat sink connecting protrusion.

As shown in FIGS. 3a and 3b, at least one heat sink connecting protrusion 304 protruding in the second direction Y is positioned on each side of the heat sink 300 parallel to the third direction Z. Correspondingly, as shown in FIG. 2a, the heat sink positioning device comprises a plurality of protrusion receiving members 110 positioned on the heat sink installation surface 106 outside each side of the heat sink 300 parallel to the third direction Z. Each heat sink connecting protrusion 304 is inserted into the respective protrusion receiving member 110 in the second direction Y. As shown in FIG. 2c, the protrusion receiving member 110 is formed in a boss and may have a depth D1 in the second direction Y. The depth D1 of the protrusion receiving member 110 may be larger than or equal to a protruding length of each heat sink connecting protrusion 304 (see FIG. 3a).

The protrusion receiving member 110 limits a movement of the heat sink in the first direction X. In an embodiment, if a size H1 (see FIG. 2c) of a receiving space in the protrusion receiving member 110 in the first direction X is equal to or slightly larger than that of the heat sink connecting protrusion 304 in the first direction X, the protrusion receiving member 110 may limit the movement of the heat sink received therein in the first direction X.

Figures 8A, 9A:
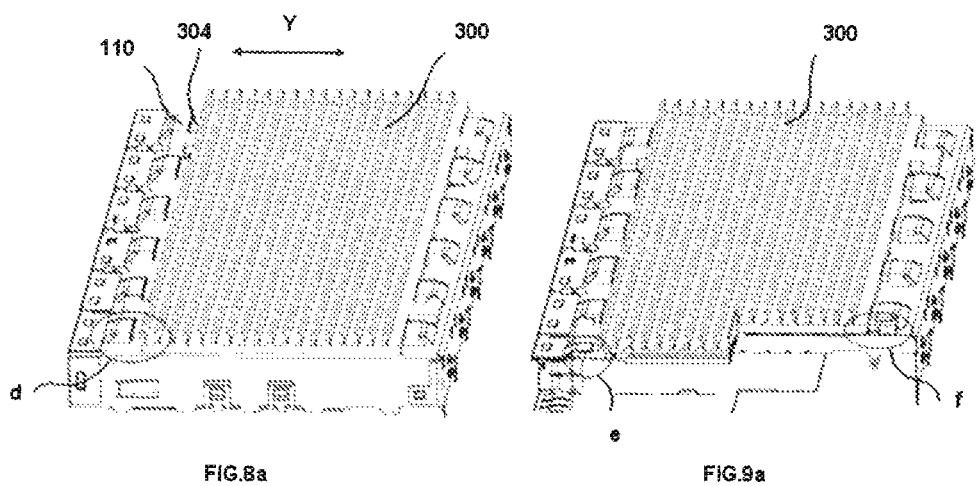
FIG. 8a is a perspective view of a heat sink connecting protrusion on the first side of the heat sink positioned in a corresponding protrusion receiving member in the connector housing, a heat sink connecting protrusion on the other side of the heat sink is disposed in a respective protrusion receiving member.
FIG. 9a is a partial cross-sectional view of FIG. 8a showing heat sink connecting protrusions on the first and second sides of the heat sink that are positioned in respective protrusion receiving members in the connector housing.

In an embodiment shown in FIG. 2a, the protrusion receiving member 110 is positioned on each opposing side of the conductor receiving space 104 parallel to the third direction Z. As shown in FIG. 8a, when the protrusions 304 on one side of the heat sink 300 are fully inserted into the respective protrusion receiving members 110, extending ends of the protrusions 304 on the opposite side of the heat sink 300 are not inserted into the respective protrusion receiving members 110. Additionally, in the second direction Y, a distance between two protrusion receiving members 110 on both sides of each of the conductor receiving spaces 104 is less than a distance between extending ends of two protrusions 304 corresponding to the two protrusion receiving members 110. Restated, in the second direction Y, if a distance between two protrusion receiving members 110 on both sides of each conductor receiving space 104 is set to be G1 (see FIG. 2a), a distance between two edges of the heat sink 300 parallel to the third direction Z is set to be G2 (see FIG. 3a), and the protruding length of each heat sink connecting protrusion 304 is set to be D2, then G2+D2<G1<G2+2D2. With this configuration, the heat sink 300 may be firstly placed between the protrusion receiving members 110 on both sides of the conductor receiving space 104. Then, as shown in FIG. 8a, the protrusions 304 on one side (right side in FIG. 8a) of the heat sink 300 are fully inserted into the respective protrusion receiving members 110. At this time, also shown in FIG. 8b, extending ends of the protrusions 304 on the other side (left side in FIG. 8a) of the heat sink 300 are still spaced from the respective protrusion receiving members 110 in the second direction Y. Then, the heat sink 300 is moved leftward, as shown in FIG. 9a, so that extending ends of the protrusions 304 on the one side of the heat sink 300 are inserted into the respective protrusion receiving members 110, and the extending ends of the protrusions 304 on the other side of the heat sink 300 are also inserted into the respective protrusion receiving members 110 (see FIG. 9b).

If a size W (see FIG. 3a) of a receiving space in the protrusion receiving member 110 in the third direction Z is equal to or slightly larger than a size W1 (see FIG. 2c) of the heat sink connecting protrusion 304 in the third direction Z, the protrusion receiving member 110 may also limit the movement of the heat sink connecting protrusion 304 received therein in the third direction Z. In an embodiment, the heat sink connecting protrusion 304 has a rectangular shape.

Those of ordinary skill in the art would appreciate that in other embodiments, the protrusion receiving member 110 on each side of each conductor receiving space 104 in the second direction Y may be omitted. Additionally in other embodiments, the protrusion receiving members 110 are not spaced at equal intervals in the second direction Y, but may be spaced at irregular intervals in the second direction Y. In an embodiment, as long as there is positioned the heat sink connecting protrusion 304 on each side of the heat sink 300 parallel to the third direction Z, and there is positioned the protrusion receiving member 110 on each side of the connector housing 100 at both sides of the heat sink 300, the basic mating requirements may be met.

In the above embodiments, the heat sink connecting protrusion 304 is inserted into the protrusion receiving member 110 in the second direction Y. However, the invention is not limited to the above embodiments, and in other embodiments, the heat sink connecting protrusion 304 may be inserted into the protrusion receiving member 110 in the third direction Z.

In an embodiment not shown but understood by those of ordinary skill in the art, at least one protrusion protruding in the second direction Y may be positioned on each side of the heat sink parallel to the third direction Z. The heat sink positioning device comprises a plurality of protrusion receiving members positioned on the heat sink installation surface outside each side of the heat sink parallel to the third direction Z. Each protrusion is adapted to be inserted into the respective protrusion receiving member in the third direction Z, and the protrusion receiving member is configured to limit a movement of the heat sink in the first direction X. In short, the protrusion receiving member is only a blocking piece with one side connected to the heat sink installation surface 106 of the housing. The blocking piece forms a sliding channel in the third direction Z. The heat sink 300 may be slid from one end of the connector housing 100 in the third direction Z to the other end of the connector housing 100, and the protrusions 304 of the heat sink is located in the sliding channel formed by the blocking piece. The sliding channel may be discontinuous. The sliding channel may further limit a movement of the heat sink in the second direction Y.

Figure 7A:
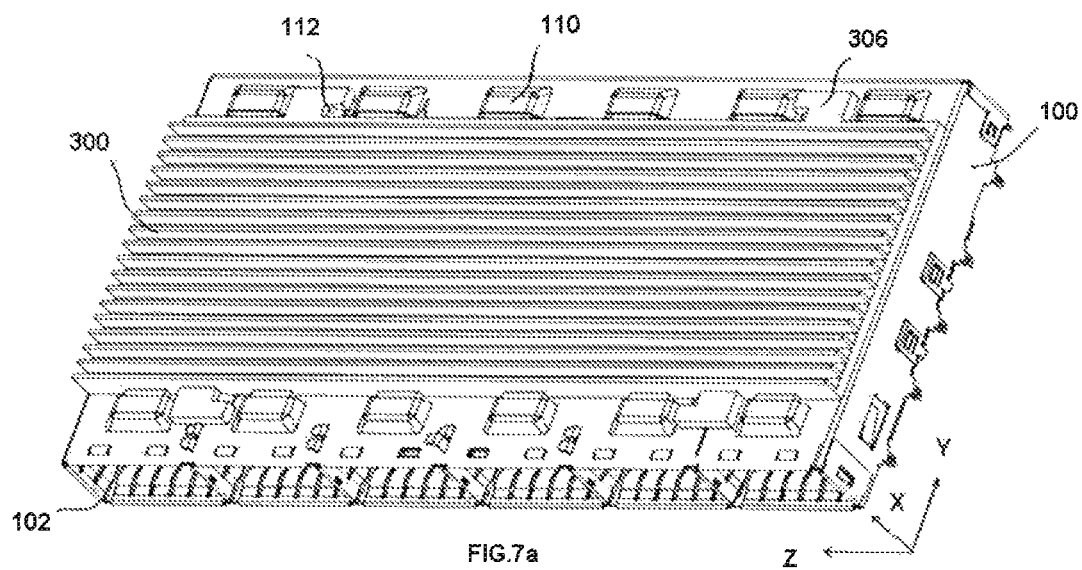
FIG. 7a is a perspective view of a connector housing assembly having the heat sink of positioned on the connector housing.

In an embodiment shown in FIGS. 2a and 7a, movement of the heat sink 300 in the second direction Y is limited by a positioning tongue 112. The heat sink positioning device further comprises a plurality of positioning tongues 112. The plurality of positioning tongues 112 are positioned on the heat sink installation surface 106 outside each side of the heat sink parallel to the third direction Z. Each positioning tongue 112 elastically deforms from a first state (see FIG. 7b), where the positioning tongue 112 is flush with the heat sink installation surface 106, to a second state (see FIG. 7c), where a tip of the positioning tongue 112 protrudes outward from the heat sink installation surface 106.

Figure 7B:
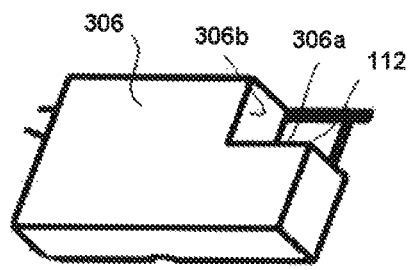
FIG. 7b is an enlarged perspective view of a positioning tongue in a first state where the positioning tongue is flush with a heat sink installation surface.
Figure 7C:
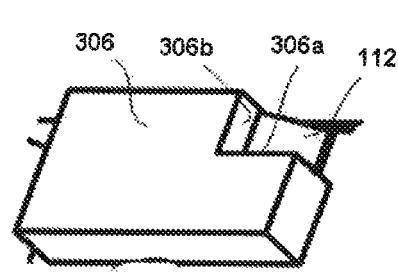
FIG. 7c is an enlarged perspective view of the positioning tongue in a second state where a tip of the positioning tongue protrudes outwards from the heat sink installation surface.

In the embodiments shown in FIGS. 3a, 3b and 7a, at least one bending projection 306 is positioned on each side of the heat sink 300 parallel to the third direction Z. The locations of the bending projections are different from the locations of the heat sink connecting protrusions 304. Each bending projection 306 has a first stopping surface 306a (see FIGS. 3a, 3b, 7b, 7c and 9c) facing the side of the heat sink 300 on which the bending projection 306 is positioned. Each bending projection 306 corresponds to each positioning tongue 112. As shown in FIG. 7c, each positioning tongue 112 in the second state engages the first stopping surface 306a of the respective bending projection 306, so as to limit the movement of the heat sink in the second direction Y.

In addition to limiting the movement of the heat sink 300 in the second direction Y, the positioning tongue 112 may further limit movement of the heat sink 300 in the third direction Z. In an embodiment shown in FIG. 7a, two bending projections 306 are positioned on each side of the heat sink 300 parallel to the third direction Z. The first stopping surface 306a of each bending projection 306 is parallel to the third direction Z. Each bending projection 306 further comprises a second stopping surface 306b (see FIGS. 7b and 7c) perpendicularly intersecting with the first stopping surface 306a. Two second stopping surfaces 306b on each side of the heat sink are positioned opposite to each other. The positioning tongue 112 has an approximate rectangular sheet structure, where two edges of each rectangular sheet structure extending perpendicular to each other engage the first stopping surface 306a and the second stopping surface 306b of the respective bending projection 306, respectively, as shown in FIG. 7b.

In an embodiment not shown but understood by those of ordinary skill in the art, only the positioning tongue limits the movement of heat sink 300 in the second direction Y, where the heat sink positioning device further comprises a plurality of positioning tongues. The plurality of positioning tongues is positioned on the heat sink installation surface 106 outside each side of the heat sink parallel to the third direction. Each positioning tongue is adapted to elastically deform from a first state where the positioning tongue is flush with the heat sink installation surface 106 to a second state where a tip of the positioning tongue protrudes outside the heat sink installation surface 106. The positioning tongues in the second state are adapted to engage both sides of the heat sink parallel to the third direction, so as to limit the movement of the heat sink in the second direction.

Figure 6A:
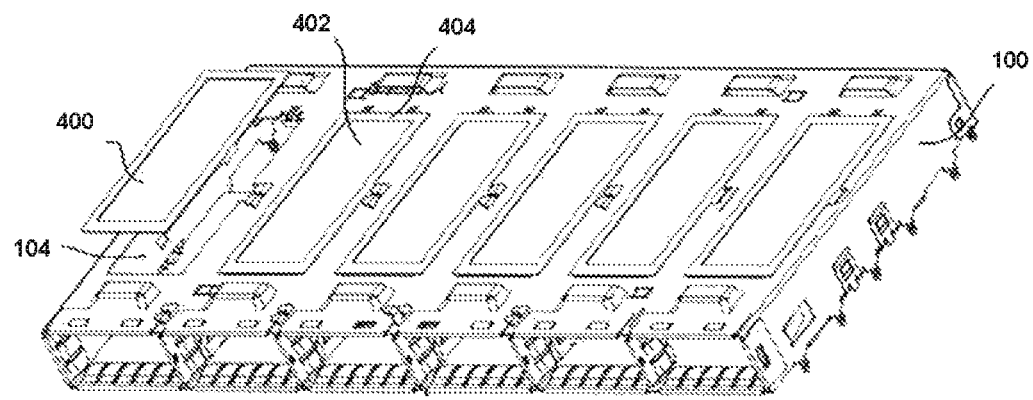
FIG. 6a is a partial exploded perspective view of the heat conduction block and the connector housing.
Figure 6B:
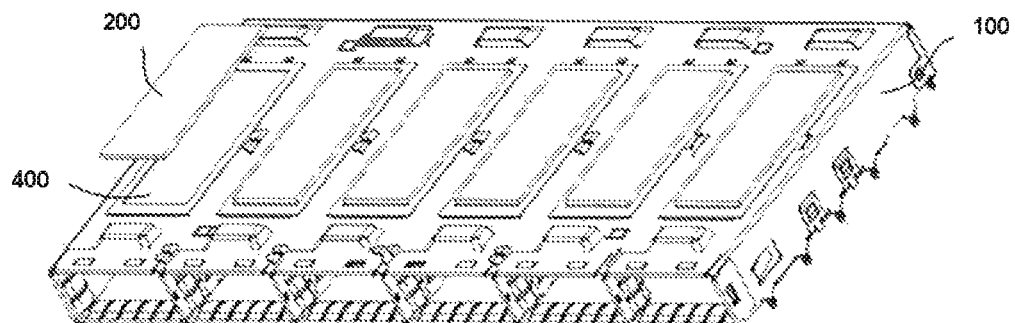
FIG. 6b is a partial exploded perspective view of the heat conduction block positioned on the connector housing and a heat conducting member.

A process of assembling the connector housing assembly will now be described with reference to the embodiments shown in FIGS. 6a-9c. The process of assembling the connector housing assembly mainly comprises steps of:

1) providing the connector housing 100 as shown in FIG. 6b.

2) placing the conducting member receiving panels 400 into the rectangular protrusion receiving members 104 in the connector housing 100, respectively.

3) placing the compressible heat conducting members 200 into the receiving recesses 402 in the conducting member receiving panels 400, respectively, as shown in FIG. 6b.

4) placing the heat sink 300 between the protrusion receiving members 110 on both sides of the connector housing 100, then, as shown in FIG. 8a, fully inserting the protrusions 304 on one side (right side in FIG. 8a) of the heat sink 300 into the respective protrusion receiving members 110. At this time, as shown in FIG. 8b, extending ends of the protrusions 304 on the other side (left side in FIG. 8a) of the heat sink 300 are still spaced from the respective protrusion receiving members 110 in the second direction Y.

Figures 8B, 9B, 9C:
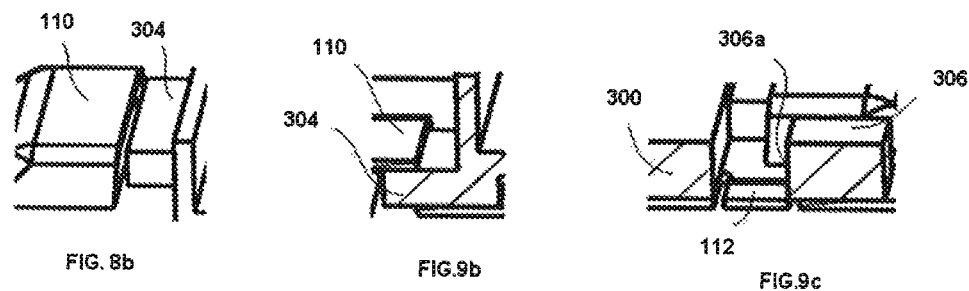

5) moving the heat sink 300 shown in FIG. 8a leftward, as shown in FIG. 9a, so that extending ends of the protrusions 304 on the one side of the heat sink 300 are inserted into the respective protrusion receiving members 110, and the extending ends of the protrusions 304 on the other side of the heat sink 300 are also inserted into the respective protrusion receiving members 110 (see FIG. 9b).

6) changing four positioning tongues 112 from the first state shown in FIG. 7b to the second state shown in FIG. 7c, so that the positioning tongues 112 engage the first stopping surface 306a of the bending projection 306 on the heat sink 300. If the positioning tongue 112 has a rectangular shape, the positioning tongues 112 may also engage the second stopping surface 306b of the bending projection 306.

In the above assembled connector housing assembly, movement of the heat sink 300 in the first direction X is limited by the protrusion receiving members 110. The movement of the heat sink 300 in the second direction Y is limited by the positioning tongues 112. The movement of the heat sink 300 in the third direction Z is limited by protrusion receiving members 110 or the positioning tongues 112.

Figure 10A:
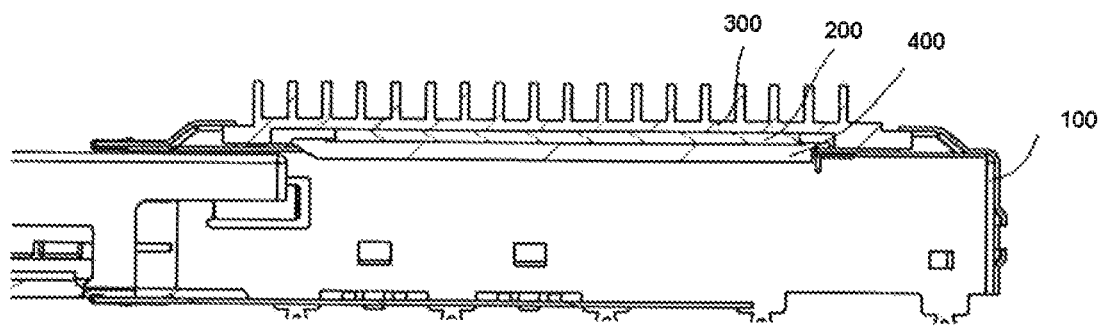

In the embodiment shown in FIG. 10a, before the heat generating module A, such as an optical module, is inserted into the module receiving port 102, the panel flange 404 of the conducting member receiving panel 400 contacts the heat sink installation surface 106 of the connector housing 100. That is, the panel flange 404 of the conducting member receiving panel 400 is positioned at the lowest position, and the compressible heat conducting member 200 is in a natural, non-compressed state or a slightly compressed state.

Figure 10B:
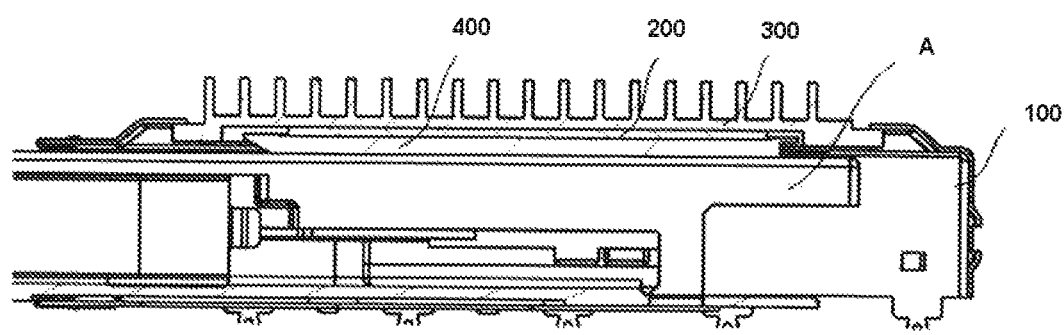

In the embodiment shown in FIG. 10b, after the heat generating module A is inserted into the module receiving port 102, the heat generating module A pushes and presses the conducting member receiving panel 400 in the first direction X, so as to move the conducting member receiving panel 400 outward in the first direction X. Since the heat sink 300 is fixed, the movement of the conducting member receiving panel 400 in the first direction X is absorbed by the compressible heat conducting member 200. Meanwhile, an effective heat transferring channel is formed among the compressible heat conducting member 200 and the conducting member receiving panel 400, as well as the heat sink 300, allowing the conducting member receiving panel 400 to effectively transfer the heat generated by the heat generating module A.

In the connector housing embodiment shown in FIG. 11, its assembling process is substantially the same as the above described assembling process, except for omitting the step of placing the conducting member receiving panel.

In another embodiment, there is also disclosed a connector comprising the above connector housing assembly. In an example, the connector may be SFF connector. Although a 1×N type QSFP+ connector, taken as an example of the SFF connector, is shown herein, all features disclosed herein are also adapted to be applied on any other SFF connector such as an SFP connector, SFP+ connector, QSFP connector, ZQSFP+ connector.

Although numerous exemplary embodiments have been shown and described, those of ordinary skill in the art would appreciate that various changes or modifications may be made in these embodiments without departing from the principles and spirit of the disclosure, the scope of which is defined in the claims and their equivalents.

What is claimed is:

1. A connector housing assembly, comprising:
a housing with a first direction corresponding to a height direction of the housing, a second direction parallel to a heat generating module insertion direction, and a third direction perpendicular to the first direction and the second direction, the housing having
  a plurality of module receiving ports positioned side by side in the third direction,
  a plurality of conductor receiving spaces corresponding to the plurality of module receiving ports respectively, and
  a heat sink installation surface;
a plurality of compressible planar heat conducting members positioned in the plurality of conductor receiving spaces respectively, each of the compressible planar heat conducting members having an elasticity in the first direction;
a monolithic heat sink positioned on a heat sink installation surface of the housing, covering and in surface-contact with the plurality of compressible heat conducting members, the heat sink having at least one heat sink connecting protrusion positioned on each side of the heat sink parallel to the third direction and protruding outward in the second direction; and
a heat sink positioning device having a plurality of protrusion receiving members positioned on the heat sink installation surface outside each side of the heat sink parallel to the third direction, each heat sink connecting protrusion inserted into one respective protrusion receiving member in the second or third direction, the protrusion receiving member limiting a movement of the heat sink in the first direction, the heat sink detachably mounted to the housing at the heat sink positioning device.

2. The connector housing assembly according to claim 1, wherein each heat sink connecting protrusion is inserted into one respective protrusion receiving member in the second direction.

3. The connector housing assembly according to claim 2, wherein each side of the conductor receiving space parallel to the third direction is positioned with the protrusion receiving member.

4. The connector housing assembly according to claim 3, wherein when the heat sink connecting protrusions on one side of the heat sink are fully inserted into the respective protrusion receiving members, the extending ends of the heat sink connecting protrusions on the other side of the heat sink are not inserted into the respective protrusion receiving members, and in the second direction, a distance between two protrusion receiving members on both sides of each of the conductor receiving spaces is less than a distance between extending ends of two heat sink connecting protrusions corresponding to the two protrusion receiving members.

5. The connector housing assembly according to claim 4, wherein: at least one protrusion receiving member limits a movement of the respective heat sink connecting protrusion in the third direction.

6. The connector housing assembly according to claim 2, wherein the heat sink positioning device further comprises a plurality of positioning tongues positioned on the heat sink installation surface outside each side of the heat sink parallel to the third direction.

7. The connector housing assembly according to claim 6, wherein each positioning tongue elastically deforms from a first state where the positioning tongue is flush with the heat sink installation surface to a second state where a tip of the positioning tongue protrudes outside the heat sink installation surface.

8. The connector housing assembly according to claim 7, wherein the positioning tongues in the second state engage two sides of the heat sink parallel to the third direction to limit the movement of the heat sink in the second direction.

9. The connector housing assembly according to claim 7, wherein at least one bending projection is positioned on each side of the heat sink parallel to the third direction at a location different from the heat sink connecting protrusion, each bending projection corresponding to each positioning tongue and having a first stopping surface facing the side of the heat sink on which the bending projection is positioned.

10. The connector housing assembly according to claim 9, wherein each positioning tongue in the second state engages the first stopping surface of the respective bending projection, limiting the movement of the heat sink in the second direction.

11. The connector housing assembly according to claim 10, wherein two bending projections are positioned on each side of the heat sink parallel to the third direction, and the first stopping surface of each bending projection is parallel to the third direction.

12. The connector housing assembly according to claim 11, wherein each bending projection further comprises a second stopping surface perpendicularly intersecting with the first stopping surface, with the two second stopping surfaces on each side of the heat sink being positioned opposite to each other.

13. The connector housing assembly according to claim 12, wherein the positioning tongue has a rectangular, planar structure, with two edges of each positioning tongue being perpendicular to each other and engaging the first stopping surface and the second stopping surface of the respective bending projection, respectively.

14. The connector housing assembly according to claim 1, wherein each heat sink connecting protrusion is inserted into the respective protrusion receiving member in the third direction.

15. The connector housing assembly according to claim 14, wherein a total length of the at least one heat sink connecting protrusion in the third direction is less than a length of the heat sink in the third direction.

16. The connector housing assembly according to claim 14, wherein the protrusion receiving member limits a movement of the heat sink in the second direction.

17. The connector housing assembly according to claim 1, wherein the conductor receiving space is concave, having an elastic planar structure positioned on the heat sink installation surface of the housing, and a bottom surface of the conductor receiving space in surface-contact with an inserted heat generating module.

18. The connector housing assembly according to claim 17, wherein the compressible heat conducting member is positioned in the concave surface of the elastic planar structure.

19. The connector housing assembly according to claim 1, wherein the conductor receiving space has a substantially rectangular opening in the housing.

20. The connector housing assembly according to claim 1, wherein the heat generating module is an optical module.

21. A connector comprising a connector housing assembly having:
- a housing with a first direction corresponding to a height direction of the housing, a second direction parallel to a heat generating module insertion direction, and a third direction perpendicular to the first direction and the second direction, the housing having
  - a plurality of module receiving ports positioned side by side in the third direction,
  - a plurality of conductor receiving spaces corresponding to the plurality of module receiving ports respectively, and
  - a heat sink installation surface;
- a plurality of compressible planar heat conducting members positioned in the plurality of conductor receiving spaces respectively, each of the compressible planar heat conducting members having an elasticity in the first direction;
- a monolithic heat sink positioned on a heat sink installation surface of the housing, covering and in surface-contact with the plurality of compressible heat conducting members, the heat sink having at least one heat sink connecting protrusion positioned on each side of the heat sink parallel to the third direction and protruding outward in the second direction; and
- a heat sink positioning device having a plurality of protrusion receiving members positioned on the heat sink installation surface outside each side of the heat sink parallel to the third direction, each heat sink connecting protrusion inserted into one respective protrusion receiving member in the second or third direction, the protrusion receiving member limiting a movement of the heat sink in the first direction, the heat sink detachably mounted to the housing at the heat sink positioning device.

22. The connector according to claim 21, wherein the connector is a Small Form Factor connector.

23. A connector housing assembly, comprising:
- a housing with a first direction corresponding to a height direction of the housing, a second direction parallel to a heat generating module insertion direction, and a third direction perpendicular to the first direction and the second direction, the housing having
  - a plurality of module receiving ports positioned side by side in the third direction,
  - a plurality of conductor receiving spaces corresponding to the plurality of module receiving ports respectively, and
  - a heat sink installation surface;
- a plurality of compressible planar heat conducting members positioned in the plurality of conductor receiving spaces respectively, each of the compressible planar heat conducting members having an elasticity in the first direction;
- a monolithic heat sink positioned on a heat sink installation surface of the housing, covering and in surface-contact with the plurality of compressible heat conducting members; and
- a plurality of conducting member receiving panels, each conducting member receiving panel having a receiving recess and a panel flange circumferentially extending around the receiving recess.

24. The connector housing assembly according to claim 23, wherein the compressible heat conducting member is positioned in the receiving recess, the receiving recess is positioned in the respective conductor receiving space, the panel flange is supported on a peripheral edge of the housing around the conductor receiving space, and a base of the receiving recess is in surface-contact with an inserted heat generating module.

25. The connector housing assembly according to claim 24, wherein a block receiving notch is positioned in one edge of the conductor receiving space, and a complementary protruding block is positioned on the conducting member receiving panel below the panel flange at a location near or abutting the receiving recess, the protruding block being complementary to the block receiving notch and mated thereto.

26. The connector housing assembly according to claim 24, wherein a plurality of panel receiving grooves are positioned in a surface of the heat sink facing the compressible heat conducting member, each panel receiving groove mating with the conducting member receiving panel, and each conducting member receiving panel being positioned in the panel receiving groove.

27. A connector housing assembly, comprising:
- a housing with a first direction corresponding to a height direction of the housing, a second direction parallel to a heat generating module insertion direction, and a third direction perpendicular to the first direction and the second direction, the housing having
  - a plurality of module receiving ports positioned side by side in the third direction,
  - a plurality of conductor receiving spaces corresponding to the plurality of module receiving ports respectively, and
  - a heat sink installation surface;
- a plurality of compressible planar heat conducting members positioned in the plurality of conductor receiving spaces respectively, each of the compressible planar heat conducting members having an elasticity in the first direction and a boss disposed on one side in the first direction, the boss being positioned in the respective conductor receiving space to position the compressible heat conducting member in the second direction or the third direction; and
- a monolithic heat sink positioned on a heat sink installation surface of the housing, covering and in surface-contact with the plurality of compressible heat conducting members.

28. The connector housing assembly according to claim 27, wherein the boss surface-contacts an inserted heat generating module.

* * * * *